United States Patent
Woo et al.

(10) Patent No.: US 9,552,210 B2
(45) Date of Patent: Jan. 24, 2017

(54) VOLATILE MEMORY DEVICE AND METHODS OF OPERATING AND TESTING VOLATILE MEMORY DEVICE

(71) Applicant: SAMSUNG ELECTRONICS CO., LTD., Suwon-si, Gyeonggi-do (KR)

(72) Inventors: Mi-Young Woo, Seongnam-si (KR); Kwan-Yong Jin, Hwaseong-si (KR); Seock-Chan Hong, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 271 days.

(21) Appl. No.: 14/101,374

(22) Filed: Dec. 10, 2013

(65) Prior Publication Data

US 2014/0223245 A1 Aug. 7, 2014

(30) Foreign Application Priority Data

Feb. 5, 2013 (KR) .................. 10-2013-0012647

(51) Int. Cl.
| | | |
|---|---|---|
| *G06F 9/44* | (2006.01) | |
| *G11C 7/20* | (2006.01) | |
| *G11C 29/36* | (2006.01) | |
| *G11C 11/40* | (2006.01) | |
| *G11C 29/04* | (2006.01) | |

(52) U.S. Cl.
CPC .............. *G06F 9/4401* (2013.01); *G11C 7/20* (2013.01); *G11C 29/36* (2013.01); *G11C 11/40* (2013.01); *G11C 2029/0407* (2013.01)

(58) Field of Classification Search
CPC ................ G06F 1/00; G06F 1/04; G06F 1/12; G06F 1/26; G06F 1/32; G06F 11/30; G06F 15/16

See application file for complete search history.

(56) References Cited

U.S. PATENT DOCUMENTS

| 5,673,273 A * | 9/1997 | Almy ...................... G06F 11/27 327/286 |
| 5,758,055 A * | 5/1998 | Ono .................... G06F 11/2289 714/25 |
| 6,182,187 B1 * | 1/2001 | Cox ...................... G06F 9/4403 711/5 |
| 6,550,019 B1 * | 4/2003 | Ahrens ............... G06F 11/0727 713/1 |

(Continued)

FOREIGN PATENT DOCUMENTS

| JP | 2006285816 A | 10/2006 |
| JP | 4620504 | 11/2010 |

(Continued)

*Primary Examiner* — Thomas Lee
*Assistant Examiner* — Mohammad A Rahman
(74) *Attorney, Agent, or Firm* — Volentine & Whitt, PLLC

(57) ABSTRACT

A method is provided for operating a volatile memory device. The method includes performing a first initialization operation for the volatile memory device based on a boot code received from an external memory controller, storing the boot code in an internal register, reading the boot code stored in the internal register based on a first signal received from the external memory controller when the first initialization operation is not normally performed, and performing a second initialization operation for the volatile memory device based on the boot code read from the internal register.

18 Claims, 12 Drawing Sheets

(56) References Cited

U.S. PATENT DOCUMENTS

| | | | |
|---|---|---|---|
| 6,748,527 B1 * | 6/2004 | Utsumi | G06F 9/4403 713/2 |
| 7,251,171 B2 | 7/2007 | Nishimura et al. | |
| 7,352,644 B2 | 4/2008 | Lee | |
| 7,849,302 B2 | 12/2010 | Wu | |
| 8,286,044 B2 * | 10/2012 | Foster, Sr. | G06F 1/206 714/718 |
| 2003/0009644 A1 * | 1/2003 | Fujii | G11C 7/1075 711/156 |
| 2004/0250057 A1 * | 12/2004 | Fujita | G06F 9/4406 713/1 |
| 2006/0053353 A1 * | 3/2006 | Youn | G11C 29/48 714/718 |
| 2006/0064575 A1 * | 3/2006 | Jo | G06F 9/4403 713/2 |
| 2006/0179369 A1 * | 8/2006 | Bravo | G11C 29/16 714/718 |
| 2006/0233031 A1 * | 10/2006 | Jakobs | G06F 13/1689 365/198 |
| 2008/0031055 A1 * | 2/2008 | Lee | G11C 7/222 365/189.05 |
| 2008/0126776 A1 * | 5/2008 | Takayama | G06F 9/4401 713/1 |
| 2010/0088296 A1 * | 4/2010 | Periyagaram | G06F 3/061 707/705 |
| 2010/0302873 A1 | 12/2010 | Lee | |
| 2011/0016300 A1 | 1/2011 | Lee | |
| 2011/0022826 A1 * | 1/2011 | More | G06F 1/26 713/1 |
| 2011/0066903 A1 * | 3/2011 | Foster, Sr. | G06F 1/206 714/723 |
| 2011/0208883 A1 * | 8/2011 | Moon | G11C 7/1009 710/74 |
| 2012/0254601 A1 * | 10/2012 | Thorsted | G11B 19/2072 713/2 |
| 2012/0278662 A1 * | 11/2012 | Gadsing | G06F 11/2294 714/42 |
| 2013/0173970 A1 * | 7/2013 | Kleveland | G11C 29/44 714/710 |
| 2014/0157229 A1 * | 6/2014 | Crowell | G06F 8/30 717/110 |

FOREIGN PATENT DOCUMENTS

| | | |
|---|---|---|
| KR | 20060030392 A | 4/2006 |
| KR | 0710988 B | 4/2007 |
| KR | 20070069877 A | 7/2007 |
| KR | 20100024801 A | 3/2010 |

\* cited by examiner

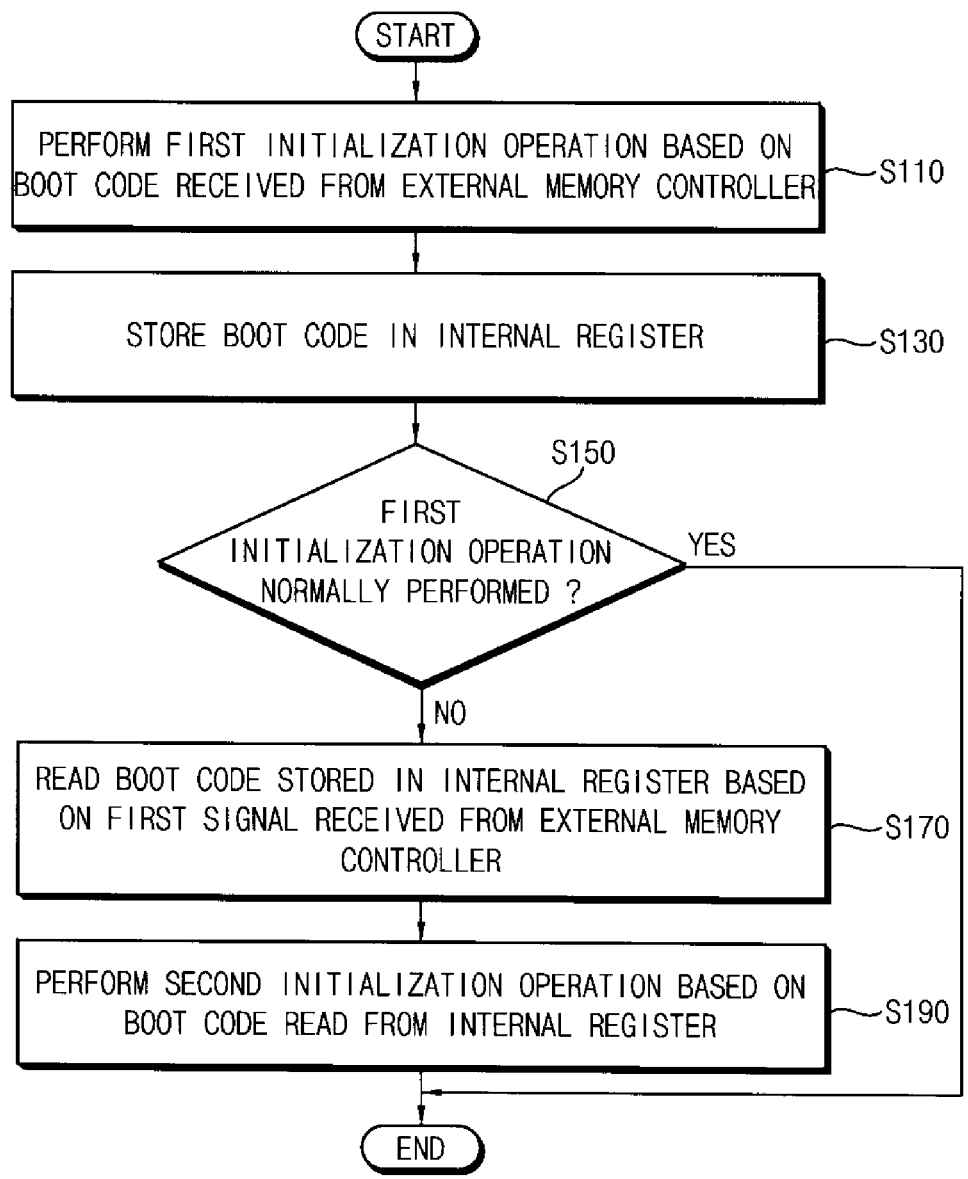

VOLATILE MEMORY DEVICE AND METHODS OF OPERATING AND TESTING VOLATILE MEMORY DEVICE

CROSS-REFERENCE TO RELATED APPLICATION

A claim for priority under 35 U.S.C. §119 is made to Korean Patent Application No. 2013-0012647, filed on Feb. 5, 2013, in the Korean Intellectual Property Office, the entire contents of which are hereby incorporated by reference.

BACKGROUND

Exemplary embodiments relate generally to a semiconductor memory device, and more particularly to a method of operating a volatile memory device and a method of testing a volatile memory device.

Semiconductor memory devices may be classified as volatile memory devices or non-volatile memory devices according to whether stored data are lost when power is shut off. Volatile memory devices lose stored data when the power is removed, and may be reset for normal operation whenever power is restored. In recent years, as volatile memory devices have become more widely used for mobile devices, for example, various research and studies have been carried out in order to reduce booting time of mobile devices by reducing the initialization time of the corresponding volatile memory devices.

SUMMARY

Accordingly, embodiments of the inventive concept are provided to substantially obviate one or more problems due to limitations and disadvantages of the related art.

Some exemplary embodiments provide a method of operating a volatile memory device, capable of reducing initialization time. Some exemplary embodiments provide a method of operating a volatile memory device, capable of reducing a test time.

According to exemplary embodiments, a method is provided for operating a volatile memory device. The method includes performing a first initialization operation for the volatile memory device based on a boot code received from an external memory controller, storing the boot code in an internal register, reading the boot code stored in the internal register based on a first signal received from the external memory controller when the first initialization operation is not normally performed, and performing a second initialization operation for the volatile memory device based on the boot code read from the internal register.

The first initialization operation may be a normal boot operation by which the volatile memory device is initialized for a first time after power is applied to the volatile memory device. The second initialization operation may be a silence boot operation by which the volatile memory device is again initialized while power is continuously supplied to the volatile memory device after the normal boot operation.

The method may further include activating the first signal when it is determined based on a result of the normal boot operation that the volatile memory device is not normally initialized.

The boot code may include a series of mode register set (MRS) codes, and the internal register may be a mode register.

Reading the boot code stored in the internal register may include outputting a series of first MRS codes from among the MRS codes stored in the mode register based on the first signal.

The method may further include selecting and outputting the first MRS codes based on the first signal using a multiplexer of the volatile memory device.

The method may further include generating a reset signal for initializing the volatile memory device based on the first MRS codes using an initialization unit of the volatile memory device.

The boot code may include a series of first MRS codes, and the internal register be a multi-purpose register. The method may further include storing a plurality of MRS codes including the first MRS codes in a mode register of the volatile memory device.

The first signal may include a flag signal or a preset command signal. The method may further include initializing a memory core of the volatile memory device based on the reset signal, where the memory core stores write data and generates and outputs read data.

According to other exemplary embodiments, a method is provided for testing a volatile memory device. The method includes performing a first test operation for the volatile memory device based on a first command signal and test data received from an external tester; storing the test data in an internal register; reading the test data stored in the internal register based on a second command signal when the second command signal is received from an external memory controller; and performing a second test operation for the volatile memory device based on the test data read from the internal register.

The method may further include detecting a defective memory cell of the volatile memory device based the first test operation, and receiving a repair command signal from the external tester for repairing the defective memory cell.

The second command signal may be generated for performance of the second test operation when the first test operation is not normally performed. Also, the first test operation may be an initial test operation to initially test the volatile memory device using the tester after the volatile memory device is manufactured, and the second test operation may be an additional test operation to test again the volatile memory device indirectly using the tester or without using the tester after the initial test operation.

According to other exemplary embodiments, a volatile memory device is provided that includes an internal register, an initialization unit and a memory core. The internal register is configured to store first mode register set (MRS) codes included in a boot code received from a memory controller in a first initialization mode. The initialization unit is configured to perform a first initialization operation for the volatile memory device in the first initialization mode based on the first MRS codes included in the boot code received from the memory controller, and to perform a second initialization operation for the volatile memory device in a second initialization mode based on the first MRS codes included in an internal boot code received from the internal register when the first initialization operation is not normally performed. The memory core is configured to store write data and to output read data. The memory core is initialized based on a reset signal RST activated by the initialization unit in response to one of the first and second initialization operations.

The volatile memory device may further include a multiplexer configured to select the first MRS codes from the internal register in response to a first signal received from the memory controller in the second initialization mode, and to provide the selected first MRS codes as the internal boot code to the initialization unit. The internal register may include one of a mode register and a multi-purpose register.

The memory core may include a memory cell array having a plurality of memory cells connected to a plurality of word lines and a plurality of bit lines, a row decoder configured to select at least one of the word lines in response to a row address, a column decoder configured to select at least one of the bit lines in response to a column address, and a sense amplifier configured to sense data stored in memory cells of the memory cell array corresponding to a word line selected by the row decoder and a bit line selected by the column decoder to generate the read data.

The volatile memory device may further include a data input/output buffer configured to receive the write data from the memory controller, to transmit the read data to the memory controller, and to be initialized based on the reset signal.

In the method of operating a volatile memory device according to exemplary embodiments described herein, when the first initialization operation is not normally performed, the second initialization operation is performed based on a boot code stored in the internal register without again receiving a boot code from a memory controller, so time required to initialize the volatile memory device can be reduced.

In the method of testing a volatile memory device according to exemplary embodiments, in order to perform an additional test operation after the first test operation, the second test operation is performed based on test data stored in the internal register without again receiving test data from a tester, so time required to test the volatile memory device can be reduced.

BRIEF DESCRIPTION OF THE DRAWINGS

Illustrative, non-limiting embodiments will be more clearly understood from the following detailed description taken in conjunction with the accompanying drawings.

FIG. 1 is a flowchart illustrating a method of operating a volatile memory device, according to an exemplary embodiment.

DETAILED DESCRIPTION OF THE EMBODIMENTS

Figure 2A:
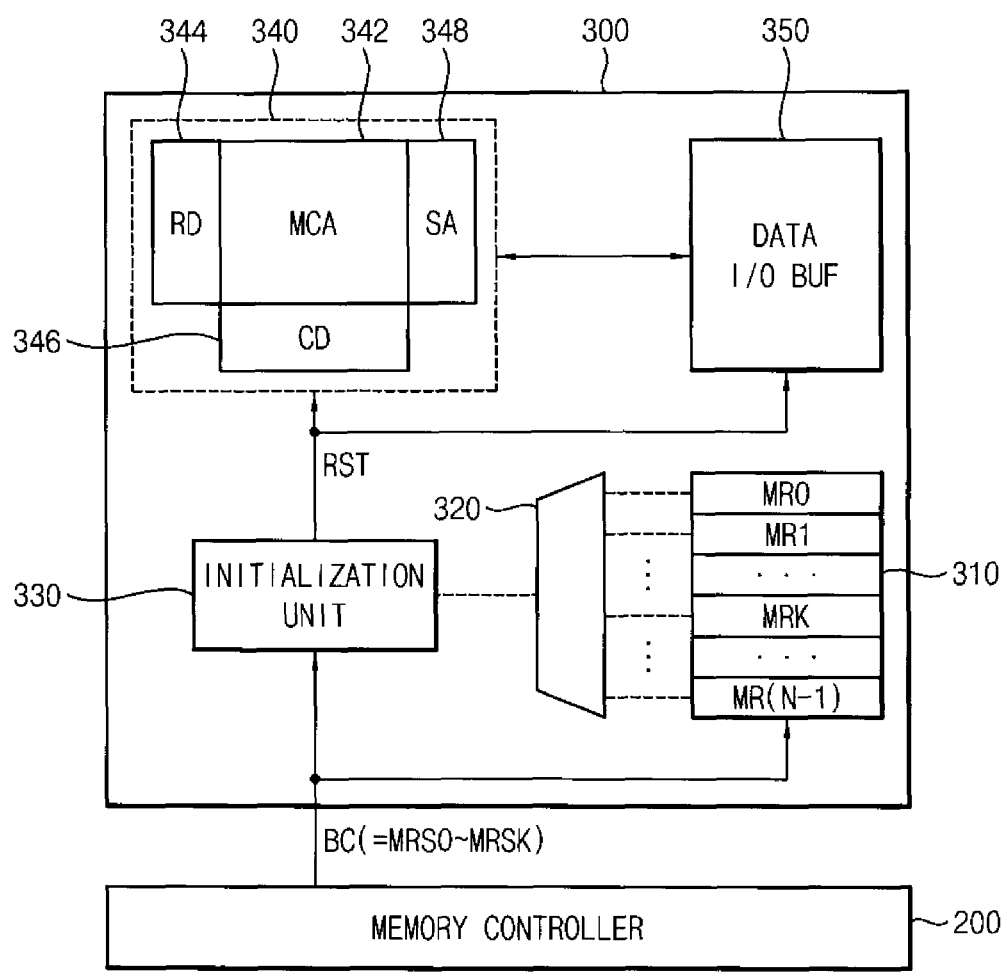
FIGS. 2A and 2B are block diagrams illustrating examples of memory systems including the volatile memory device operated by the method shown in FIG. 1, according to an exemplary embodiment.

Various exemplary embodiments will be described in particular with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals refer to like elements throughout the attached drawings and written description, and thus descriptions will not be repeated.

It will be understood that, although the terms first, second, etc., may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other. The term "exemplary" refers to an example or illustration.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flowchart illustrating a method of operating a volatile memory device, according to an exemplary embodiment.

The method of operating a volatile memory device illustrated in FIG. 1 may be applied to a volatile memory device including a separate storage space capable of storing a boot code for initializing the volatile memory device. The following description will address dynamic random access memory (DRAM), for purposes of explanation, although the method of operating the volatile memory device according to exemplary embodiments may be applied to other types of volatile memory devices, such as mobile DRAM and static random access memory (SRAM), for example. A detailed configuration of the volatile memory device is described below with reference to FIGS. 2A, 2B, 4A, 4B, 5A, and 5B.

Referring to FIG. 1, in the method of operating the volatile memory device, a first initialization operation for the volatile memory device is performed based on a boot code received from an external memory controller (step S110). The boot code is stored in an internal register (step S130). For example, when the volatile memory device is a DRAM device, the boot code may include a series of mode register set (MRS) codes, and the internal register may include a mode register and/or a multi-purpose register.

A second initialization operation is selectively performed based on the result of the first initialization operation. In particular, it is determined whether the first initialization operation is normally performed (step S150). When the first initialization operation is not performed normally (NO of step S150), the boot code stored in the internal register is read based on a first signal received from the external memory controller (step S170), and the second initialization operation for the volatile memory device is performed based on the boot code read from the internal register (step S190). The first signal is configured simply as compared with the boot code. For example, when the volatile memory device is a DRAM device, the first signal may be a flag signal or a preset command signal. When the first initialization operation is normally performed (YES of step S150), the read operation of the boot code and the second initialization operation are not performed.

In exemplary embodiments, the first initialization operation may be a normal boot operation and the second initialization operation may be a silence boot operation. The normal boot operation signifies an operation by which the volatile memory device is initialized for the first time after power is applied to the volatile memory device. The silence boot operation may signify an operation by which the volatile memory device is again initialized in a state that power is continuously supplied to the volatile memory device after the normal boot operation.

In general, when a computing system is powered on, an operating system (OS) is booted by a processor, such as a microprocessor or a central processing unit (CPU), and simultaneously, a volatile memory device included in the computing system is initialized. A silence booting function has been applied to the computing system, particularly, to a mobile system. According to the silence booting function, when an error occurs during OS booting, the computing system again performs the OS booting and initialization of the volatile memory device while maintaining the power-on state, that is, without sequentially performing power-off and power-on of the computing system, so that a user is not necessarily made aware of the occurrence of the error.

In the method of operating the volatile memory device according to exemplary embodiments, the first initialization operation (that is, the normal boot operation) is performed based on the boot code received from the memory controller, and the boot code is stored in the internal register while performing the first initialization operation. In addition, the second initialization operation (that is, the silence boot operation) is performed based on the boot code stored in the internal register without have to again receive the boot code from the memory controller when the first initialization is not normally performed. Accordingly, time required to reinitialize the volatile memory device after initialization failure of the volatile memory device is reduced, and thus time required to initialize the volatile memory device is likewise reduced.

Figure 2B:
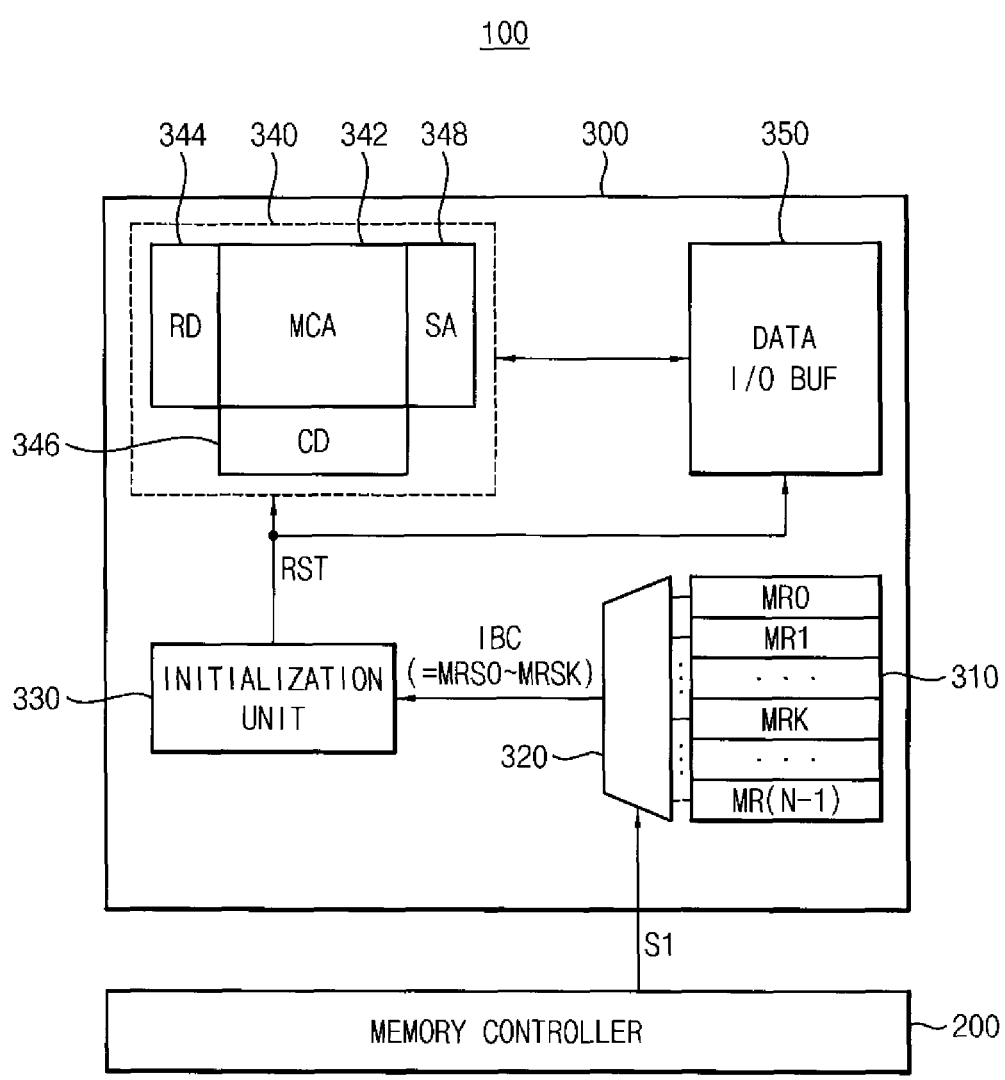

FIGS. 2A and 2B are block diagrams illustrating examples of memory systems including the volatile memory device operated by the method shown in FIG. 1, according to an exemplary embodiment. FIG. 2A illustrates a first initialization mode in which the first initialization operation is performed, and FIG. 2B illustrates a second initialization mode in which the second initialization operation is performed.

Referring to FIGS. 2A and 2B, a memory system 100 includes a memory controller 200 and a volatile memory device 300.

The memory controller 200 is configured to control the volatile memory device 300. When power is supplied to the memory system 100, the memory controller 200 provides a boot code BC for the first initialization operation to the volatile memory device 300, as shown in FIG. 2A. When the first initialization operation is not performed normally, a first signal S1 for the second initialization operation is supplied to the volatile memory device 300, as shown n FIG. 2B. As described above with reference to FIG. 1, the boot code BC may include a series of first MRS codes MRS0 to MRSK, and the first signal S1 may be a flag signal or a preset command signal. The memory controller 200 may control data exchange between an external host (not shown) and the volatile memory device 300.

The volatile memory device 300 includes a mode register 310, a multiplexer 320, an initialization unit 330, a memory core 340, and a data input/output buffer 350. Although not shown, the volatile memory device 300 may further include an address buffer, a command decoder, a latency circuit, a clock synchronization circuit, and an on-die termination (ODT) circuit, for example.

The mode register 310 includes a plurality of registers MR0, MR1, . . . , MRK, . . . , and MR(N−1). The mode register 310 is configured to store a series of first MRS codes MRS0 to MRSK corresponding to the boot code BC in the first initialization mode, and to output a series of first MRS codes MRS0 to MRSK among multiple MRS codes in the second initialization mode. For example, the MRS code MRS0 may be stored in a register MR0, and the MRS code MRSK may be stored in a register MRK. In the exemplary embodiment of FIGS. 2A and 2B, the mode register 310 corresponds to the internal register.

The multiplexer 320 is configured to select the series of first MRS codes MRS0 to MRSK based on the first signal S1 in the second initialization mode, and to output the selected first MRS codes MRS0 as an internal boot code IBC. The multiplexer 320 may be inactivated in the first initialization mode.

The initialization unit 330 is configured to generate a reset signal RST for initializing the volatile memory device 300 based on the boot code BC or the internal boot code IBC. In particular, the initialization unit 330 may activate the reset signal RST based on the boot code BC, that is, the first MRS codes MRS0 to MRSK received from the memory controller 200 in the first initialization mode. Alternatively, the initialization unit 330 may activate the reset signal RST based on the internal boot code IBC, that is, the first MRS codes MRS0 to MRSK read from the mode register 310 in the second initialization mode.

The memory core 340 is configured to store write data, generate and output read data, and be initialized based on the reset signal RST. In the depicted embodiment, the memory core 340 includes a memory cell array 342 having memory cells connected to a plurality of word lines and a plurality of bit lines to store data, a row decoder 344 selecting at least one word line from the plurality of word lines of the memory cell array 342 in response to a row address received from an address buffer (not shown), a column decoder 346 selecting at least one bit line from the plurality of bit lines of the memory cell array 342 in response to a column address from the address buffer, and a sense amplifier 348 sensing data stored in memory cells corresponding to a word line selected by the row decoder 344 and a bit line selected by the column decoder 346 among the memory cells to generate the read data.

The data input/output buffer 350 is configured to receive the write data from the memory controller 200, and to transmit the read data to the memory controller 200. The data input/output buffer 350 is initialized based on the reset signal RST. The data input/output buffer 350 may be connected to data input/output pins (not shown).

According to exemplary embodiments, the volatile memory device 300, the memory controller 200, and/or the memory system may be implemented using various types of packages. For example, the volatile memory device 300, the memory controller 200, and/or the memory system 100 may be implemented using a package such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Figure 3:
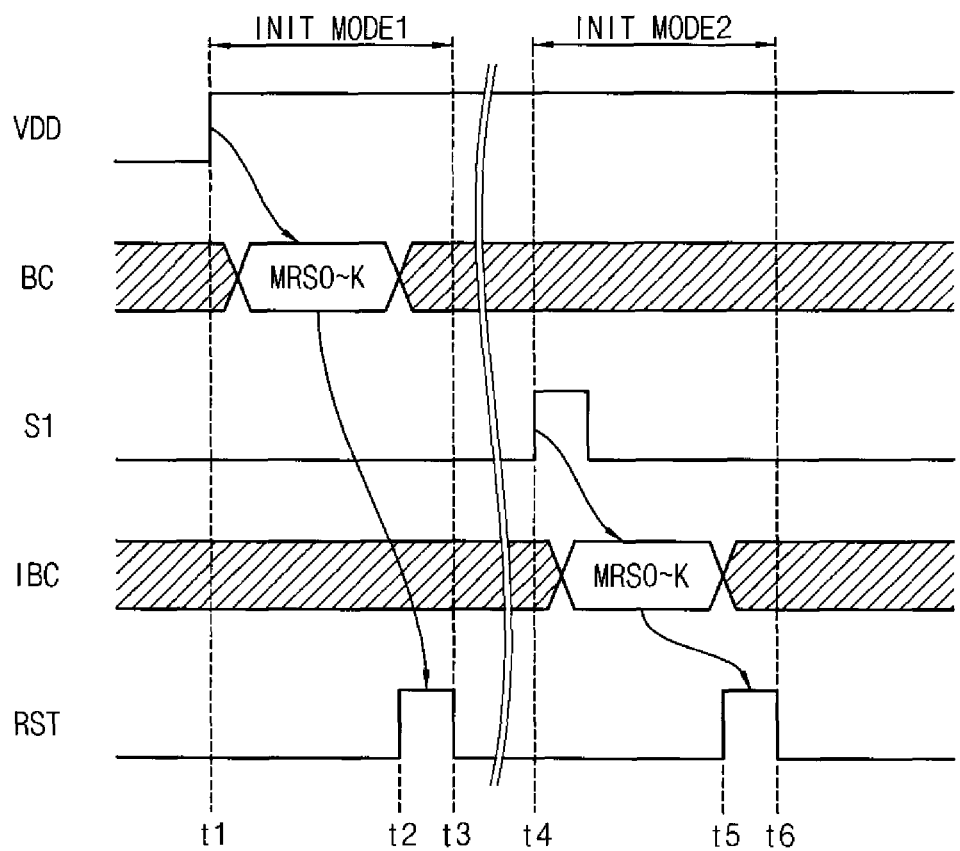
FIG. 3 is a timing diagram illustrating the memory systems shown in FIGS. 2A and 2B, according to an exemplary embodiment.

FIG. 3 is a timing chart illustrating the memory systems shown in FIGS. 2A and 2B, according to an exemplary embodiment.

Referring to FIGS. 2A, 2B, and 3, power is applied to the memory system 100 at first timing t1, so that power supply VDD is activated and a first initialization mode INIT MODE1 starts. As the power supply VDD is activated, the memory controller 200 provides a boot code BC corresponding to a series of first MRS codes MRS0 to MRSK to the mode register 310 and the initialization unit 330 of the volatile memory device 300. The initialization unit 330 activates a reset signal RST based on the first MRS codes MRS0 to MRSK provided from the memory controller 200 at second timing t2, and the first MRS codes MRS0 to MRSK are stored in the mode register 310. The memory core 340 and the data input/output buffer 350 are initialized based on the activated reset signal RST. The reset signal RST is inactivated at third timing t3, terminating the first initialization mode INIT MODE1.

When the memory core 340 and the data input/output buffer 350 are not normally initialized in the first initialization mode INIT MODE1, that is, when it is determined based on the result of the normal boot operation that the volatile memory device 300 is not normally initialized, a first signal S1 is activated at the fourth timing t4. Accordingly, a second initialization mode INIT MODE2 starts. The memory controller 200 provides the first signal S1 to the multiplexer 320 of the volatile memory device 300. The multiplexer 320 provides the first MRS codes MRS0 to MRSK stored in the mode register 310 to the initialization unit 330 as the internal boot code IBC. The initialization unit 330 activates the reset signal RST based on the series of first MRS codes MRS0 to MRSK provided from the mode register 310 (via the multiplexer 320) at the fifth timing t5. The memory core 340 and the data input/data buffer 350 are initialized based on the activated reset signal RST. The reset signal RST is inactivated at sixth timing t6, terminating the second initialization mode INIT MODE2.

Although not shown, when the memory core 340 and the data input/output buffer 350 are normally initialized in the first initialization mode INIT MODE1, the second initialization operation corresponding to the fourth to sixth timings t4 to t6 of FIG. 3 may not be performed.

Figure 4A:
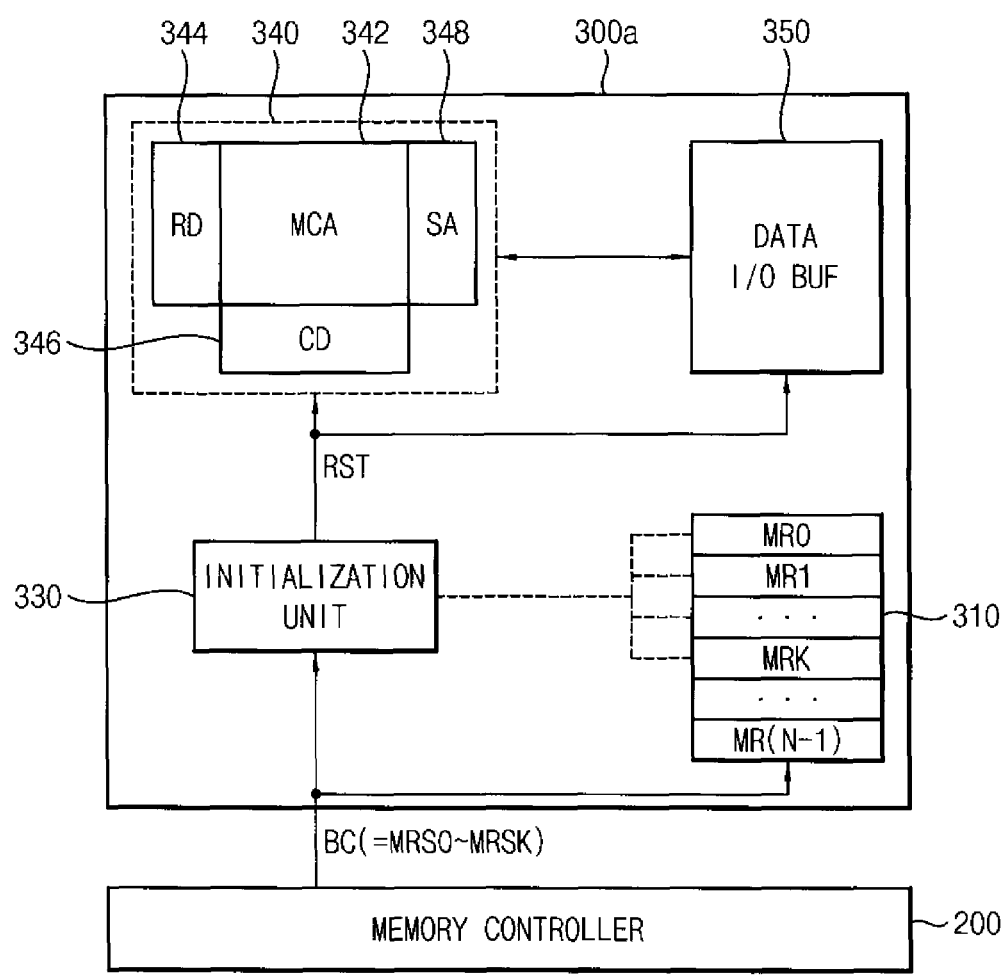
FIGS. 4A and 4B are block diagrams illustrating other examples of a memory system including the volatile memory device operated by the method shown in FIG. 1, according to an exemplary embodiment.
Figure 4B:
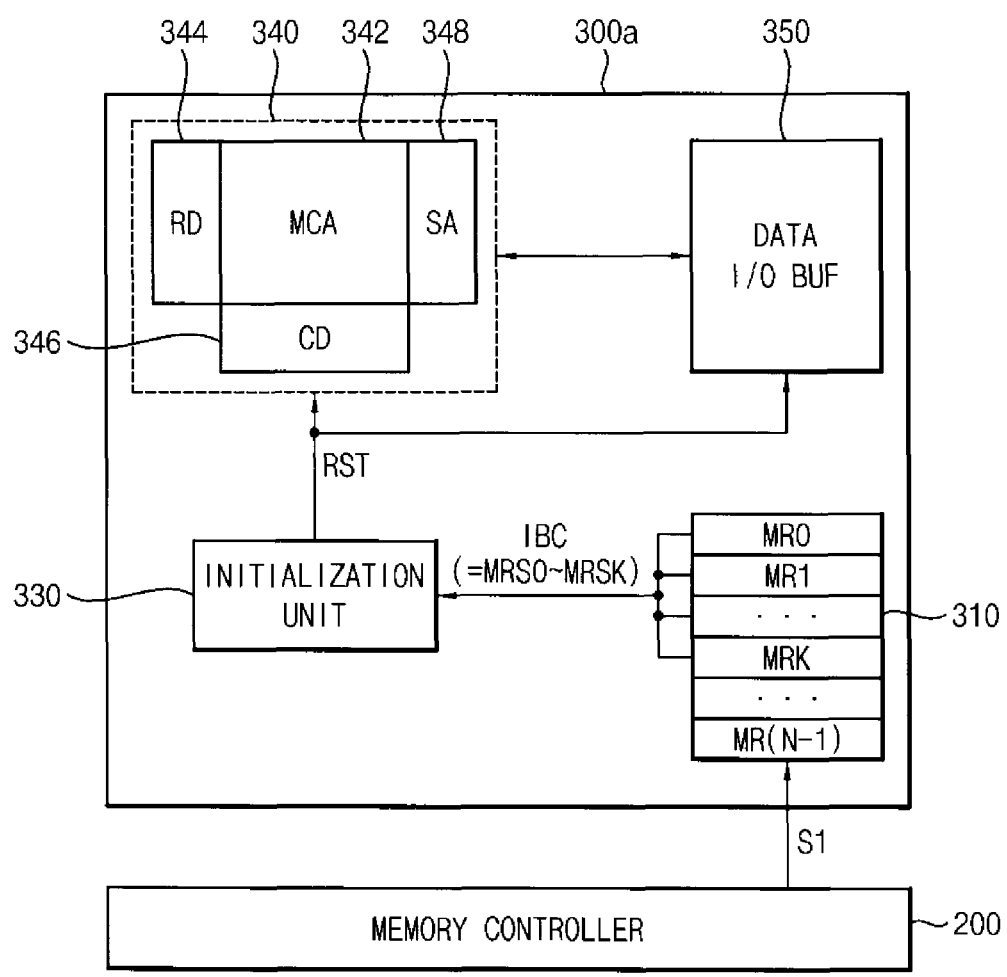

FIGS. 4A and 4B are block diagrams illustrating other examples of memory systems including the volatile memory device operated by the method shown in FIG. 1, according to an exemplary embodiment. FIG. 4A illustrates the first initialization mode and FIG. 4B illustrates the second initialization mode.

Referring to FIGS. 4A and 4B, the memory system 100a includes a memory controller 200 and a volatile memory device 300a.

The memory controller 200 may be substantially the same as the memory controller 200 of FIGS. 2A and 2B, discussed above.

The volatile memory device 300a may be substantially the same as the volatile memory device 300 of FIGS. 2A and 2B, discussed above, except that the multiplexer is not included. That is, the volatile memory device 300a includes a mode register 310, an initialization unit 330, a memory core 340, and a data input/output buffer 350. The mode register 310 is configured to store a series of first MRS codes MRS0 to MRSK corresponding to the boot code BC in the first initialization mode. The mode register 310 is further configured to select the first MRS codes MRS0 to MRSK from multiple MRS codes based on the first signal S1 in the second initialization mode, and to output the selected first MRS codes MRS0 to MRSK as the internal boot code IBC. The initialization unit 330 may generate a reset signal RST for initializing the volatile memory device 300 based on the boot code BC or the internal boot code IBC. The memory core 340 is configured to store write data, and to generate and output read data. As discussed above, the memory core 340 includes a memory cell array 342, a row decoder 344, a column decoder 346, and a sense amplifier 348. The data input/output buffer 350 may receive the write data from the memory controller 200, transmit the read data to the memory controller 200, and be initialized based on the reset signal RST.

Figure 5A:
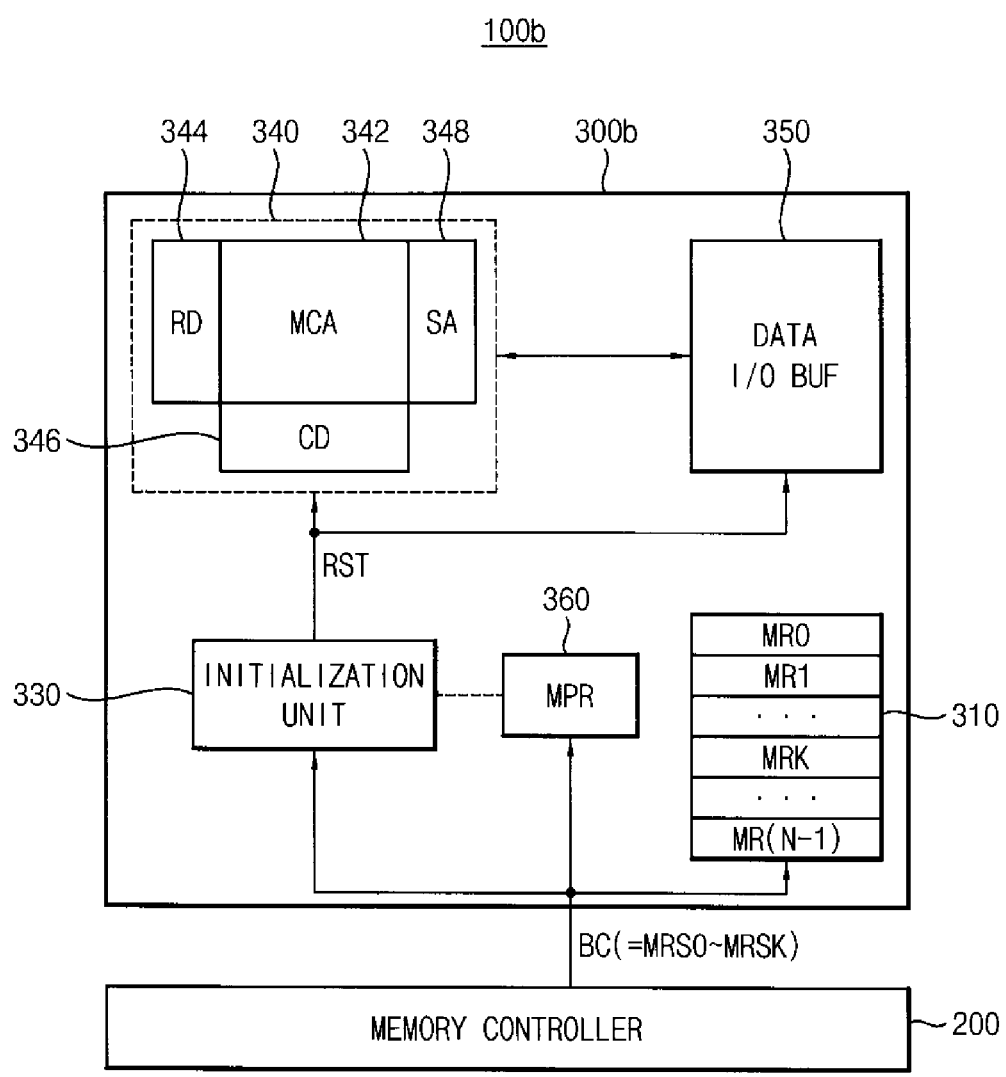
FIGS. 5A and 5B are block diagrams illustrating other examples of a memory system including the volatile memory device operated by the method shown in FIG. 1, according to an exemplary embodiment.
Figure 5B:
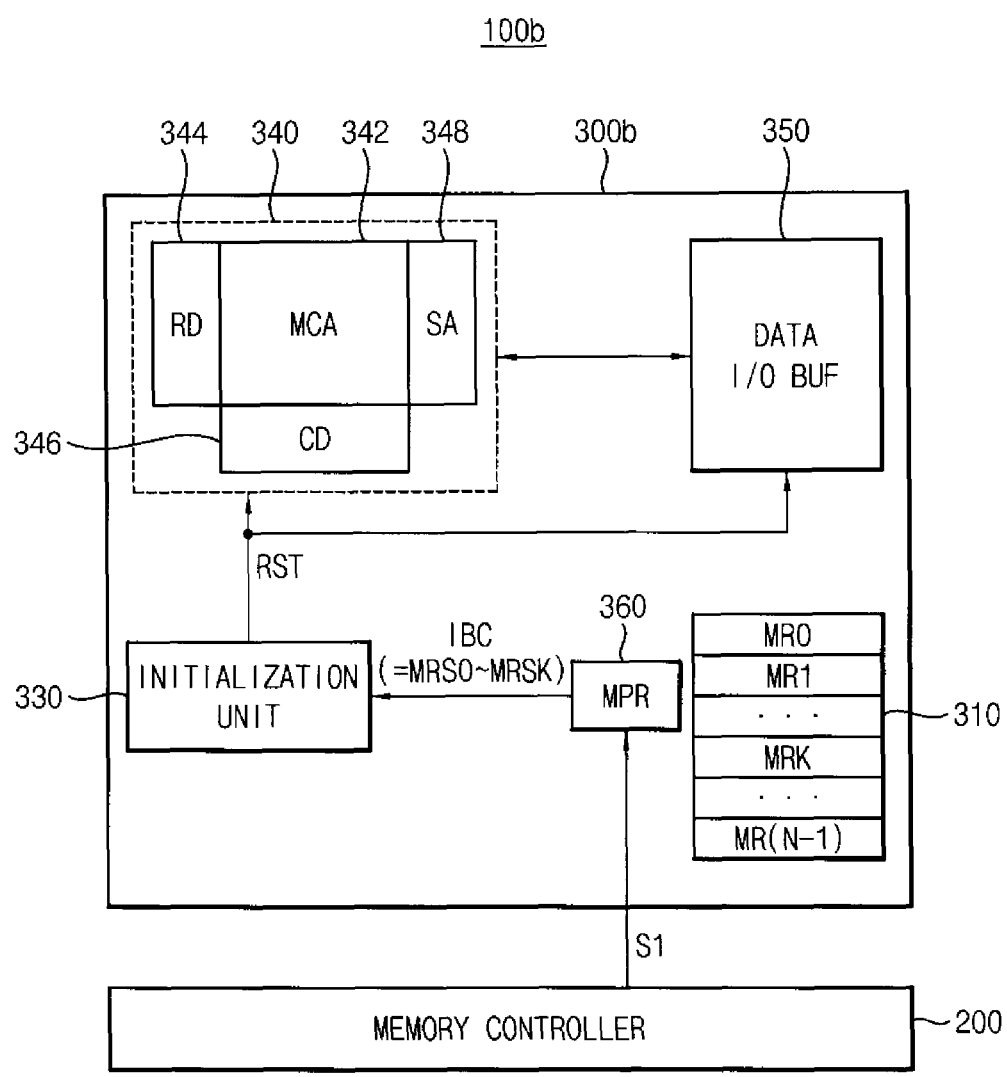

FIGS. 5A and 5B are block diagrams illustrating other examples of memory systems including the volatile memory device operated by the method shown in FIG. 1. FIG. 5A illustrates the first initialization mode, and FIG. 5B illustrates the second initialization mode.

Referring to FIGS. 5A and 5B, the memory system 100b include a memory controller 200 and a volatile memory device 300b.

The memory controller 200 may be substantially the same as the memory controller 200 of FIGS. 2A and 2B, discussed above.

The volatile memory device 300b includes a mode register 310, a multi-purpose register 360, an initialization unit 330, a memory core 340, and a data input/output buffer 350. The mode register 310 stores multiple MRS codes including a series of first MRS codes MRS0 to MRSK corresponding to a boot code BC. The multi-purpose register 360 is configured to store the first MRS codes MRS0 to MRSK corresponding to the boot code BC in the first initialization mode, and to output the first MRS codes MRS0 to MRSK as an internal boot code IBC based on a first signal S1 in the second initialization mode. In exemplary embodiments of FIGS. 5A and 5B, the multi-purpose register 360 may correspond to the internal register. The initialization unit 330 may generate a reset signal RST for initializing the volatile memory device 300 based on the boot code BC or the internal boot code IBC. The memory core 340 stores write data, generates and outputs read data, and is initialized based on the reset signal RST. The memory core 340 may include a memory cell array 342, a row decoder 344, a column decoder 346, and a sense amplifier 348. The data input/output buffer 350 may receive the write data from the memory controller 200, transmit the read data to the memory controller 200, and be initialized based on the reset signal RST.

Figure 6:
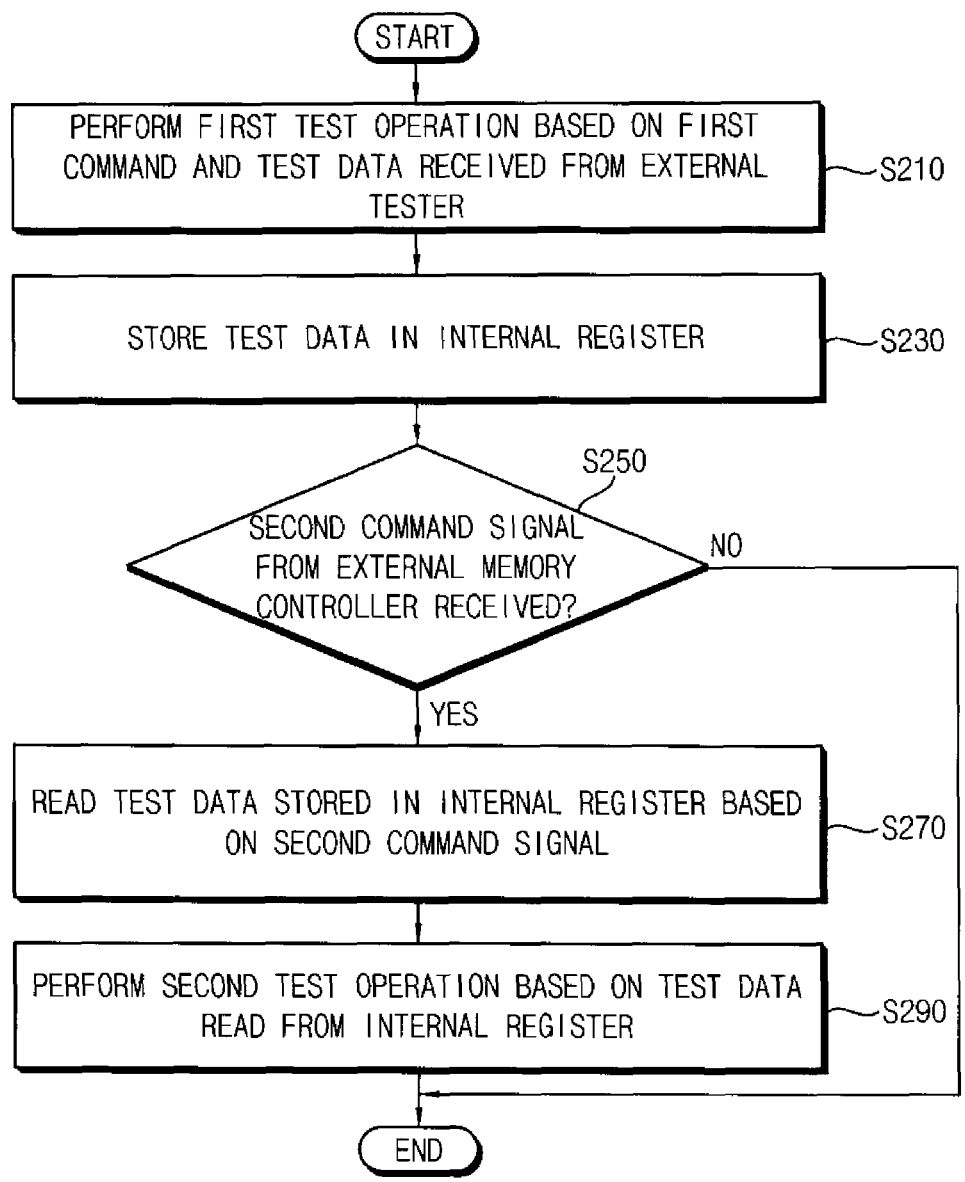
FIG. 6 is a flowchart illustrating a method of testing the volatile memory device, according to an exemplary embodiment.

FIG. 6 is a flowchart illustrating a method of testing a volatile memory device, according to an exemplary embodiment.

The method of testing the volatile memory device shown in FIG. 6 may be used in a volatile memory device including a separate storage space capable of storing test data for testing the volatile memory device. A detailed configuration of examples of the volatile memory device will be described below with reference FIGS. 7A and 7B.

Referring to FIG. 6, in the method of testing the volatile memory device, a first test operation for the volatile memory device is performed based on a first command and test data received from an external tester (step S210). The test data are stored in an internal register (step S230). For example, when the volatile memory device is a DRAM device, the internal register may be a multi-purpose register. According to exemplary embodiments, the internal register may be implemented as a non-volatile memory device such that the test data may be preserved even when the power supply to the volatile memory device is shut off.

After the first test operation, a second test operation is selectively performed based on whether a second command signal different from the first command signal is received. In particular, it is determined whether a second command signal is received from an external memory controller (step S250). When the second command signal is received from the external memory controller (YES of step S250), the test data stored in the internal register are read based on the second command signal (step S270). A second test operation for the volatile memory device is performed based on the test data read from the internal register (step S290). When the second command signal is not received from the external memory controller (NO of step S250), the read operation of the test data and the second test operation are not performed.

In exemplary embodiments, the first test operation may be an initial test operation and the second test operation may be an additional test operation. The initial test operation signifies an operation to initially test the volatile memory device directly using the tester after the volatile memory device is manufactured. The additional test operation signifies an operation to test again the volatile memory device indirectly using the tester or without using the tester after the initial test operation.

In exemplary embodiments, when the first test operation is not normally performed, the second command signal may be received. In other exemplary embodiments, when the volatile memory device has been launched after the first test operation is normally performed by a manufacturer of the volatile memory device, if a user of the volatile memory device wants to perform an additional test of the volatile memory device, the second command signal may be received.

In the method of testing the volatile memory device, according to exemplary embodiments, a first test operation (that is, initial test operation) is performed based on test data received from a tester, and the test data are stored in the internal register while performing the first test operation. When the first test operation is not normally performed, or when an additional test operation is to be performed after the first test operation, a second test operation (that is, additional test operation) is performed based on test data stored in an internal register without receiving again the test data from the tester. Accordingly, time required to test the volatile memory device is reduced.

Figure 7A:
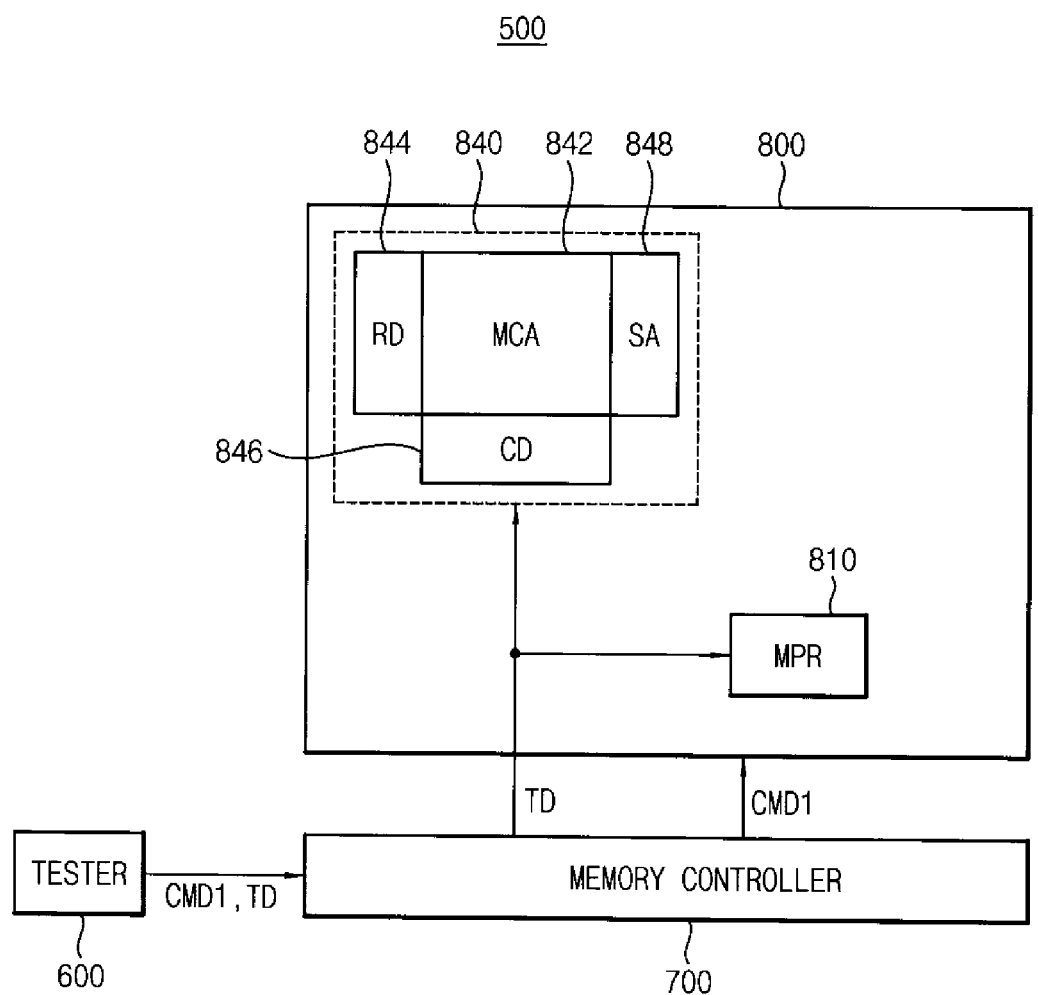
FIGS. 7A and 7B are block diagrams illustrating examples of a test system including the volatile memory device tested by the method shown in FIG. 6, according to an exemplary embodiment.
Figure 7B:
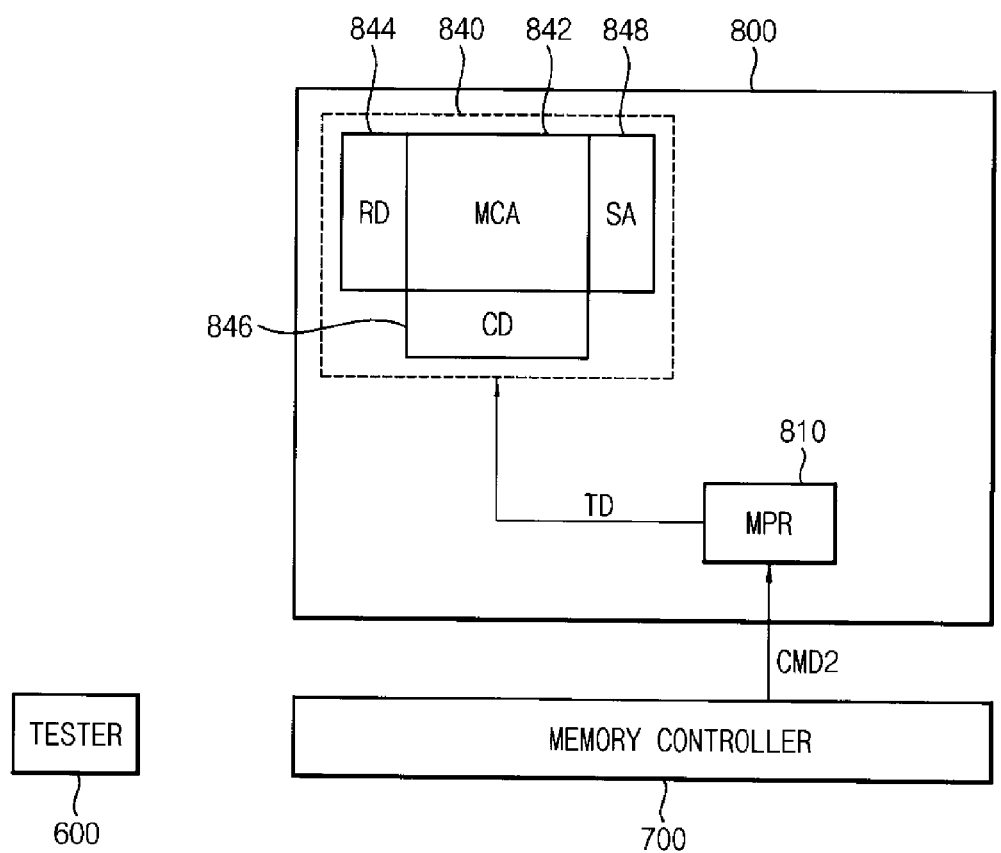

FIGS. 7A and 7B are block diagrams illustrating examples of a test system including the volatile memory device tested by the method shown in FIG. 6, according to an exemplary embodiment. FIG. 7A illustrates a first test mode in which the first test operation is performed, and FIG. 7B illustrates a second test mode in which the second test operation is performed.

Referring to FIGS. 7A and 7B, the test system 500 includes a tester 600, a memory controller 700, and a volatile memory device 800.

The tester 600 is configured to test the volatile memory device 800 in a first test mode. For example, the tester 600 may provide a first command signal CMD1 and test data TD to the volatile memory device 800 through the memory controller 700 in the first test mode. The test data TD may be stored in a memory cell array 842 of the volatile memory device 800. The tester 600 may read the test data TD stored in the memory cell array 842 through the memory controller 700, and compare the read data with the test data TD to test the volatile memory device 800. Further, when a defective memory cell is detected in the test result, the tester 600 may provide a repair command signal (not shown) to the volatile memory device 800 through the memory controller 700.

The memory controller 700 is configured to control the volatile memory device 800. The memory controller 700 may provide a first command signal CMD1 and test data TD received from the tester 600 in the first test mode, and may provide a second command signal CMD2 to the volatile memory device 800 in the second test mode. Unlike the first command signal CMD1, the second command signal CMD2 may be generated by the memory controller 700, independently from the tester 600.

The volatile memory device 800 includes a multi-purpose register 810 and a memory core 840. Although not shown, the volatile memory device 800 may further include a mode register, a data input/output buffer, an address buffer, a command decoder, a latency circuit, a clock synchronization circuit, and an ODT circuit, for example.

The multi-purpose register 810 is configured to store the test data TD in the first test mode, and to provide the test data TD to the memory core 840 based on the second command signal CMD2 in the second test mode. In exemplary embodiments of FIG. 7A, the multi-purpose register 810 may correspond to the internal register. Meanwhile, as described above with reference to FIG. 6, the internal register may be implemented as a non-volatile memory.

The memory core 840 is configured to store the test data TD based on the first command CMD1 or the second command CMD2, and to generate and output read data corresponding to the test data TD. In the depicted embodiment, the memory core 840 includes a memory cell array 842, a row decoder 844, a column decoder 846, and a sense amplifier 848. Further, when a defective memory cell is detected in the test result, the memory core 840 may perform a repair operation based on the repair command signal received from the tester 600, so that a redundant memory may substitute for the defective memory cell.

Figure 8:
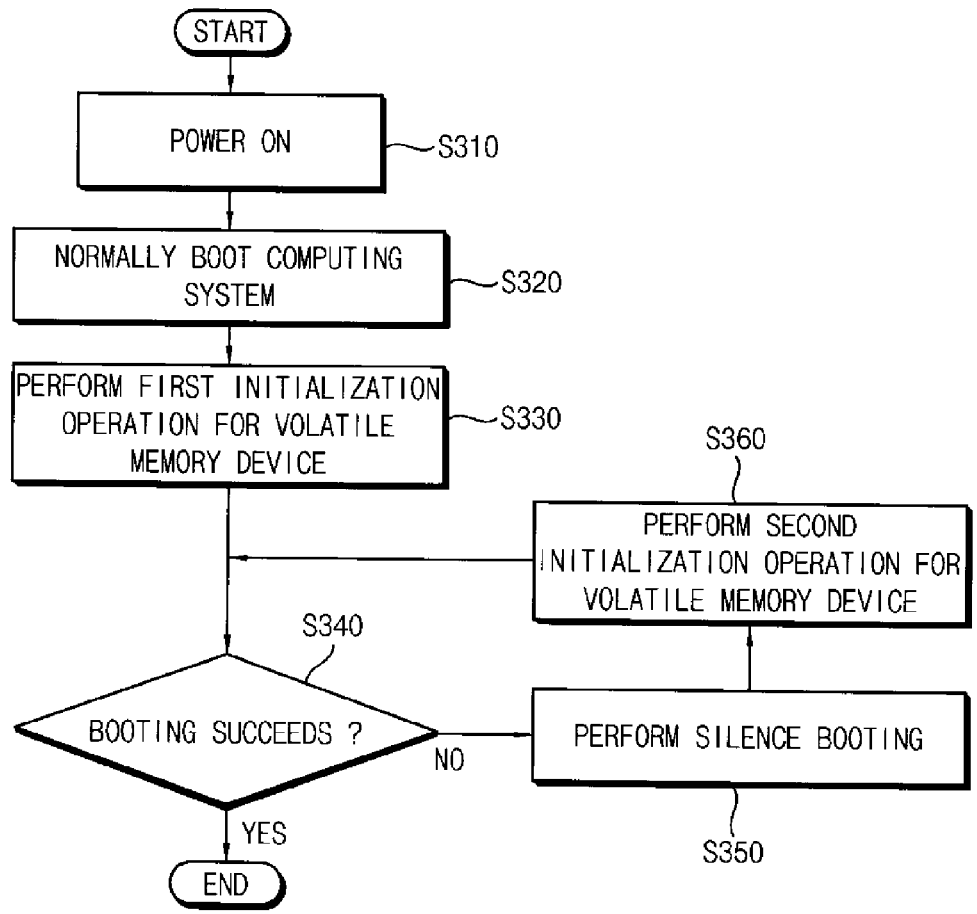
FIG. 8 is a flowchart illustrating a method of operating a computing system, according to an exemplary embodiment.

FIG. 8 is a flowchart illustrating a method of operating a computing system, according to an exemplary embodiment.

Referring to FIG. 8, in the method of operating a computing system, the computing system is powered on (step S310). That is, power is applied to the computing system. The computing system is normally booted (step S320). For example, an OS is booted by a processor, such as a microprocessor or a CPU included in the computing system.

A first initialization operation for a volatile memory device included in the computing system is performed (step S330). The first initialization operation may signify an operation where the volatile memory device is initialized for the first time after the computing system is powered on, that is, after power is applied to the volatile memory device. For example, as described with reference to steps S110 and S130 of FIG. 1, the volatile memory device is initialized based on a boot code received from a memory controller, and the boot code is stored in an internal register included in the volatile memory device so that the first initialization operation may be performed.

Silence booting and a second initialization operation may be selectively performed based on the result of the normal booting, as discussed above. In particular, when the computing system is not normally booted (NO of step S340), silence booting with respect to the computing system is performed (step S350). For example, the computing system may reboot the OS while maintaining the power-on state, that is, without performing power-off and then power-on of the computing system. In this case, a booting screen is continuously maintained after the normal booting, so that the user is not necessarily made aware of the silence booting. A second initialization operation for the volatile memory device is performed (step S360). For example, as described above with reference to steps S170 and S190 of FIG. 1, the boot code stored in the internal register is read based on a first signal received from the memory controller, and the volatile memory device is initialized based on the boot code read from the internal register, so that the second initialization operation may be performed. When the computing system is normally booted (YES of step S340), the silence booting and the second initialization operation are not performed.

Figure 9:
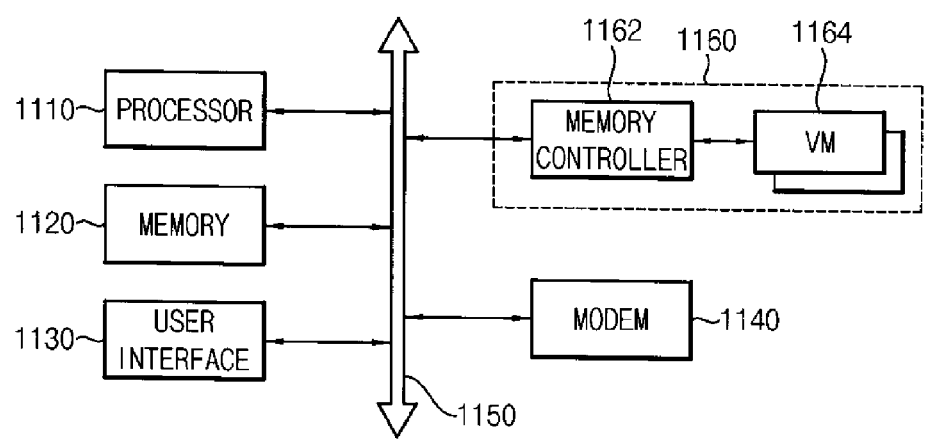
FIG. 9 is a block diagram illustrating the computing system, according to exemplary embodiments.

FIG. 9 is a block diagram illustrating the computing system, according to exemplary embodiments.

Referring to FIG. 9, the computing system 1100 includes a processor 1110, a memory device 1120, a user interface 1130, and a memory system 1160. According to exemplary embodiments, the computing system 1100 may further include a modem 1140, such as a baseband chipset.

The processor 1110 may perform various calculations or tasks. For example, the processor 1110 may be a microprocessor or a CPU. The processor 1110 may be connected to the memory device 1120 through a bus 1150, such as an address bus, a control bus, and/or a data bus. For example, the memory device 1120 may be implemented by DRAM, mobile DRAM, SRAM, a flash memory device, Phase Change Random Access Memory (PRAM), Resistance Random Access Memory (RRAM), Magnetic Random Access Memory (MRAM), and/or Ferroelectric random access memory (FRAM).

Further, the processor 1110 may be connected to an extension bus, such as a peripheral component interconnect (PCI) bus. Accordingly, the processor 1110 may control the user interface 1130 including at least one input device, such as a key board or a mouse, and at least one output device, such as a printer or a display device. The modem 1140 may transmit data to and receive data from an external device in a wireless scheme.

Data processed by the processor 1110 or data received through the modem 1140 may be stored in the volatile memory device 1164 of the memory system 1160 through the memory controller 1162. The volatile memory device 1164 may include a separate storage space capable of storing a boot code and/or test data, as discussed above. When the first initialization operation is not normally performed after power on, the volatile memory device 1164 performs a second initialization operation based on the boot code stored in the internal register, without again receiving the boot code from the memory controller 1162. Similarly, in order to perform an additional test operation after the first test operation, the second test operation is performed based on the test data stored in the internal register, without again receiving the test data from the tester, so that time required for initialization and/or testing can be reduced.

Although not shown in FIG. 9, the computing system 1100 may further include a power supply for supplying power supply voltage. Further, the computing system 1100 may further include additional components, such as an application chipset and a camera image processor (CIS).

Exemplary embodiments are applicable to a volatile memory device, such as a DRAM device, and various apparatuses and systems including the same. Accordingly, exemplary embodiments may be applied to various types of electronic devices, such as computers, laptop computers, cellular phones, smart phones, MP3 players, Personal Digital Assistants (PDAs), Portable Multimedia Players (PMP), digital TVs, digital cameras, and portable game consoles, including volatile memory.

While the inventive concept has been described with reference to exemplary embodiments, it will be apparent to those skilled in the art that various changes and modifications may be made without departing from the spirit and scope of the present invention. Accordingly, all such modifications are intended to be included within the scope of the present inventive concept. Therefore, it should be understood that the above embodiments are not limiting, but illustrative.

What is claimed is:

1. An operating method executed by a volatile memory device, the method comprising:
   performing a first initialization operation for the volatile memory device based on a boot code received from an external memory controller;
   storing the boot code in an internal register of the volatile memory device;
   reading the boot code stored in the internal register based on a first signal received from the external memory controller when the first initialization operation causes an operating system (OS) booting error; and
   performing a second initialization operation for the volatile memory device based on the boot code read from the internal register, wherein:
   the first initialization operation is a normal boot operation by which the volatile memory device is initialized for a first time after power is applied to the volatile memory device and the external memory controller, and
   the second initialization operation is a silence boot operation by which the volatile memory device is again initialized while power is continuously supplied to the volatile memory device and the external memory controller after the normal boot operation.

2. The method of claim 1, further comprising activating the first signal when it is determined based on a result of the normal boot operation that the volatile memory device is not normally initialized due to the OS booting error.

3. The method of claim 1, wherein the boot code comprises a series of mode register set (MRS) codes, and the internal register comprises a mode register.

4. The method of claim 3, wherein reading the boot code stored in the internal register comprises outputting a series of first MRS codes from among the MRS codes stored in the mode register based on the first signal.

5. The method of claim 4, further comprising selecting and outputting the first MRS codes based on the first signal using a multiplexer of the volatile memory device.

6. The method of claim 4, further comprising generating a reset signal for initializing the volatile memory device based on the first MRS codes using an initialization unit of the volatile memory device.

7. The method of claim 1, wherein the boot code comprises a series of first mode register set (MRS) codes, and the internal register comprises a multi-purpose register.

8. The method of claim 7, further comprising storing a plurality of MRS codes including the first MRS codes in a mode register of the volatile memory device.

9. The method of claim 1, wherein the first signal comprises a flag signal or a preset command signal.

10. The method of claim 6, further comprising initializing a memory core of the volatile memory device based on the reset signal, the memory core storing write data and generating and outputting read data.

11. A test method executed by a volatile memory device, the method comprising:
performing a first test operation for the volatile memory device based on a first command signal and test data received from an external tester;
storing the test data in an internal register of the volatile memory device;
reading the test data stored in the internal register based on a second command signal when the second command signal is received from an external memory controller; and
performing a second test operation for the volatile memory device based on the test data read from the internal register, wherein the second command signal is generated for performance of the second test operation when the first test operation causes an operating system (OS) booting error.

12. The method of claim 11, further comprising:
detecting a defective memory cell of the volatile memory device based on the first test operation; and
receiving a repair command signal from the external tester for repairing the defective memory cell.

13. The method of claim 11, wherein the first test operation is an initial test operation to initially test the volatile memory device using the tester after the volatile memory device is manufactured, and the second test operation is an additional test operation to test again the volatile memory device indirectly using the tester or without using the tester after the initial test operation.

14. A volatile memory device; comprising:
an internal register configured to store first mode register set (MRS) codes included in a boot code received from a memory controller in a first initialization mode;
an initialization unit configured to perform a first initialization operation for the volatile memory device in the first initialization mode based on the first MRS codes included in the boot code received from the memory controller, and to perform a second initialization operation for the volatile memory device in a second initialization mode based on the first MRS codes included in an internal boot code received from the internal register when the first initialization operation causes an operating system booting error; and
a memory core configured to store write data and to output read data, the memory core being initialized based on a reset signal activated by the initialization unit in response to one of the first and second initialization operations, wherein:
the first initialization operation is a normal boot operation by which the volatile memory device is initialized for a first time after power is applied to the volatile memory device and the external memory controller, and
the second initialization operation is a silence boot operation by which the volatile memory device is again initialized while power is continuously supplied to the volatile memory device and the external memory controller after the normal boot operation.

15. The volatile memory device of claim 14, further comprising a multiplexer configured to select the first MRS codes from the internal register in response to a first signal received from the memory controller in the second initialization mode, and to provide the selected first MRS codes as the internal boot code to the initialization unit.

16. The volatile memory device of claim 14, wherein the internal register comprises one of a mode register and a multi-purpose register.

17. The volatile memory device of claim 14, wherein the memory core comprises:
a memory cell array having a plurality of memory cells connected to a plurality of word lines and a plurality of bit lines;
a row decoder configured to select at least one of the word lines in response to a row address;
a column decoder configured to select at least one of the bit lines in response to a column address; and
a sense amplifier configured to sense data stored in memory cells of the memory cell array corresponding to a word line selected by the row decoder and a bit line selected by the column decoder to generate the read data.

18. The volatile memory device of claim 17, further comprising a data input/output buffer configured to receive the write data from the memory controller, to transmit the read data to the memory controller, and to be initialized based on the reset signal.

* * * * *